United States Patent [19]

Hayes

[11] Patent Number: 5,008,153
[45] Date of Patent: Apr. 16, 1991

[54] CORROSION INHIBITIVE PRETREATMENT FOR "COPPER-FREE" MIRRORS

[75] Inventor: Deborah E. Hayes, Verona, Pa.

[73] Assignee: PPG Industries, Inc., Pittsburgh, Pa.

[21] Appl. No.: 281,358

[22] Filed: Dec. 8, 1988

[51] Int. Cl.$^5$ .............................................. C23C 26/00
[52] U.S. Cl. ................................... 428/429; 427/304; 427/306
[58] Field of Search .............. 427/306, 304; 106/1.11, 106/14.16, 287.11, 287.13; 428/429

[56] References Cited

U.S. PATENT DOCUMENTS

| | | | |
|---|---|---|---|
| 2,316,011 | 4/1943 | Miller et al. | 44/57 |
| 2,393,801 | 1/1946 | Morey et al. | 106/176 |
| 2,719,827 | 10/1955 | Lowe | 252/47 |
| 3,395,036 | 7/1968 | Campbell | 106/287.13 |
| 3,837,964 | 9/1974 | Cotton et al. | 156/131 |
| 4,154,638 | 5/1979 | Franz | 106/287.11 |
| 4,246,320 | 1/1981 | Coll-Palogos | 427/306 |
| 4,247,330 | 1/1981 | Sanders | 106/287.13 |
| 4,255,214 | 3/1981 | Workens | 148/6.14 R |
| 4,297,447 | 10/1981 | Yasuda | 525/133 |
| 4,339,553 | 7/1982 | Yoshimura et al. | 524/544 |
| 4,343,660 | 8/1982 | Martin | 106/14.16 |
| 4,349,421 | 9/1982 | Khattab | 427/306 |
| 4,350,804 | 9/1982 | Ostrowski et al. | 525/327.3 |
| 4,357,396 | 11/1982 | Grunewalder et al. | 428/626 |
| 4,402,847 | 9/1983 | Wilson | 106/14.13 |
| 4,465,547 | 8/1984 | Belke, Jr. et al. | 156/629 |
| 4,495,247 | 1/1985 | Vasta | 428/422 |
| 4,612,049 | 9/1986 | Berner et al. | 106/14.13 |
| 4,612,236 | 9/1986 | Hsu | 427/388.2 |
| 4,645,714 | 2/1987 | Roche | 428/480 |
| 4,656,097 | 4/1987 | Claffey et al. | 428/457 |
| 4,714,564 | 12/1987 | Lynch et al. | 252/110 |
| 4,721,747 | 1/1988 | Doshi | 524/261 |
| 4,725,501 | 2/1988 | Rukavina | 106/287.19 |
| 4,749,741 | 6/1988 | Saito | 106/287.13 |
| 4,770,727 | 9/1988 | Siegl | 148/257 |
| 4,790,878 | 12/1988 | Siegl | 106/14.15 |
| 4,808,483 | 2/1989 | Nakasuji | 427/407.2 |

FOREIGN PATENT DOCUMENTS

| | | | |
|---|---|---|---|
| 58-130283 | 8/1983 | Japan . | |
| 58-50941 | 11/1983 | Japan . | |
| 1097576 | 6/1984 | U.S.S.R. | 106/287.11 |
| 1050785 | 12/1966 | United Kingdom . | |
| 1057871 | 2/1967 | United Kingdom . | |

OTHER PUBLICATIONS

Corrosion Science, "Short Communication—2-Mercaptothiazoline as Corrosion Inhibitor for Copper in Acidic Media" (1974), vol. 14, pp. 233–237 by A. B. Patel et al.

Journal of Electrochemical Society of India, "Some Azoles as Corrosion Inhibitors for Copper, Brass and Aluminum" by K. P. Soni and I. M. Bhatt, 32-2[1983], pp. 197–199.

Journal of Coatings Technology, "Organosilanes as Adhesion Promoters for Organic Coatings", presented at the 58th Annual Meeting of the Federation of Societies for Coatings Technology in Atlanta, Ga., Oct. 1980, by Peter Walker.

Primary Examiner—Shrive Beck
Assistant Examiner—Vi Duong Dang
Attorney, Agent, or Firm—Godfried R. Akorli

[57] ABSTRACT

A pretreatment composition comprising a combination of an adhesion promoter and corrosion inhibitor which is applied to the surface of a substrate and a process for pretreating the surface of a substrate before the deposition of thin metallic films to prepare mirrored substrates.

11 Claims, No Drawings

CORROSION INHIBITIVE PRETREATMENT FOR "COPPER-FREE" MIRRORS

BACKGROUND OF THE INVENTION

1. Field of the Invention

The present invention relates to protective coatings for thin films of metals, such as silver or aluminum, a combination of silver and copper, or the like, which are applied to substrates. More specifically, the present invention relates to pretreatment compositions for thin metallic films, such as silver, which are applied to substrates such as glass.

2. Brief Description of the Prior Art

It is known in the art to deposit thin metallic films on substrates for functional and/or aesthetic reasons. For example, thin films of silver are deposited on glass to produce mirrors or other reflective surfaces for purposes such as energy conservation. Depending on the intended use, the thin metallic films may vary widely in thickness. For example, the metallic films on mirrors typically vary in thickness and range from about 3 to about 10 microinches (from about 76.2 to about 254 millimicrons) whereas partially reflective metallic films on windows, where the films serve as solar reflectors, vary in thickness and range from about $4 \times 10^{-8}$ inches to about $20 \times 10^{-8}$ inches (about 1 to about 5.1 millimicrons).

To preserve the integrity of the thin metallic films, protective materials in the form of, say, additives, pertinent among which are corrosion inhibitors, are employed therewith. Conventionally, protective materials, typically incorporated in coatings, are applied to the back of the metallic films. This mode of application is herein denoted as a "conventional" application. In contrast, the protective materials of this invention are applied as pretreatment compositions.

SUMMARY OF THE INVENTION

In accordance with the foregoing, the present invention encompasses a pretreatment composition for enhancing the corrosion resistance of a substrate, said composition is applied prior to the deposition of a thin metallic film on the substrate. The pretreatment composition comprises a combination of:
(A) an adhesion promoter and
(B) a corrosion inhibitor
wherein (A) is selected from the group consisting of an organo-functional silane compound, a titanium compound, a zirconium compound, and a mixture thereof, and (B) is selected from the group consisting of a nitrogen containing heterocyclic compound, a metallic compound, and a mixture thereof. This mode of application is herein denoted as a "pretreatment" application.

The present invention further encompasses an improved method of preparing substrates coated with thin metallic films by depositing the thin metallic films on the substrate, the improvement comprising applying a protective material to the substrate before the thin metallic film is applied.

Also, the present invention encompasses an article of matter prepared with the composition or method of the present invention. Particularly suited to this invention are mirrors and methods of preparing the same by treating the surface of glass before depositing thereon a thin metallic film of silver. An article of matter which is prepared by the present invention exhibits a marked improvement in the properties of adhesion and corrosion resistance and other desirable properties.

DETAILED DESCRIPTION OF THE INVENTION

As aforestated, the present invention is a pretreatment composition comprising a combination of (A) an adhesion promoter and (B) a corrosion inhibitor; said composition typically comprises a carrier. The nature and amount of the adhesion promoter or the corrosion inhibitor depend on each other and the carrier that may be present therewith. The adhesion promoters which are useful herein are selected on the basis that they provide bonding or coupling to the interface of the substrate and the thin metallic film. The corrosion inhibiting agents are selected on the basis that they prevent degradation, particularly chemical degradation, of the thin metallic film. Also, determinative in making the selection is the compatibility of the adhesion promoter or corrosion inhibitor with the carrier. By "compatible" is meant that the combination of adhesion promoter and the corrosion inhibitor is soluble in, or in phase with, the carrier.

In the present embodiment of the invention, the adhesion promoter can be selected from the group consisting of a functional silane compound, titanium compound, zirconium compound, and a mixture thereof.

Non-limiting examples of the silane compounds useful herein can be organo silanes such as amino alkyl and/or mercapto alkyl silanes, e.g., gamma-aminopropyltriethoxy silane, aminopropyltrimethoxy silane, N-beta(aminoethyl)-gamma-aminopropyltrimethoxy silane, and gamma-mercaptopropyltrimethoxy silane. Based on the teachings herein, other silane compounds useful herein can be found in SILANE COUPLING AGENTS by Edwin P. Plueddemann, New York, Plenum Press (1982), which is incorporated herein by reference.

Non-limiting examples of the functional zirconium compounds useful herein can be organo zirconium compounds such as zirconates. Particularly preferred herein are compounds such as neoalkoxy tris(ethylene diamino)ethyl zirconates. Based on the teachings herein, other zirconium compounds useful herein are coupling agents such as disclosed in the ENCYCLOPEDIA OF CHEMICAL TECHNOLOGY, Second Edition by Kirk & Othmer, Vol. 22, which is incorporated herein by reference.

Non-limiting examples of the titanium compounds useful herein can be organic titanates, titanium chelates, and coordination compounds. Particularly preferred herein are bis(2,4-pentanedionato-0,0') bis(2-propanolato)-titanium (iv); bis [2,2',2"-nitrilo tris[ethanolato]](1-)-N,O]bis(2propanolato)-titanium (iv). Based on the teachings herein, other titanium compounds useful herein are coupling agents such as disclosed in the ENCYCLOPEDIA OF CHEMICAL TECHNOLOGY, Second Edition, by Kirk & Othmer, Vol. 20, which is incorporated herein by reference.

Corrosion inhibitors useful herein can be substituted or unsubstituted heterocyclic nitrogen containing compounds, particularly the five-membered compounds. The substituent should be that which does not adversely affect the reaction thereof or the performance of the pretreatment composition. Typical substituents can be a mercapto, amino or carboxyl groups.

Non-limiting examples thereof can be selected from the group consisting of benzotriazole; 2-mercaptothiazole; 2-amino-1,2,4 triazole; 2,5-dimercapto-1,3,4 thiadiazole, and 2-aminothiazole; 2-mercaptothiazoline and 2-aminothiazoline. Preferred herein as a corrosion inhibitor are heterocyclic mercapto carboxylic acid esters and anhydrides such as (2-benzimidazolylthio) succinic acid, or (2-thio-2'-benzo-thiazolyl)butanedioic acid. Based on the teachings herein, other corrosion inhibitors useful herein can be found in U.S. Pat. No. 4,612,049, which is incorporated herein by reference.

The metallic compounds (other than zirconium or titanium compounds) useful herein can be corrosion inhibitive organic or inorganic metallic compounds such as lead salts, zinc salts, calcium salts, and the like.

Carriers are employed herewith for ease of preparation or application. Liquid carriers which are capable of wetting the substrate are preferred herein. The carriers are typically solvents, although resinous carriers, e.g., resinous polyols, can be employed. The preferred carriers are polar solvents. Examples of useful carriers can be water, alcohol, preferably lower alcohols, or a mixture thereof. Specific examples of the alcohols can be ethanol, which is preferred, methanol, isopropanol, butanol, glycol ethers, such as propylene glycol monobutyl ether.

In preparing the solution-based compositions of this invention, the combination of the adhesion promoter and corrosion inhibitor can be introduced into a common solvent separately or together. Alternately, different solvents can be employed. The combination can be a physical admixture or chemical composition of the adhesion promoter and the corrosion inhibitor. The weight ratio of the adhesion promoter to the corrosion inhibitor is from about 2:1 to 4:1 and preferably from about 3.5:1 to 4.5:1.

In the practice of this invention, the solution-based pretreatment composition is employed at application solids of about 2 to 5 percent or higher and preferably about 3.0 to 5.0 percent of total composition, and at pH of about 8 to 12 and preferably about 8 to 10. When water is employed, its conductivity should be such as does not adversely affect the subsequent deposition of the thin metallic film on the pretreated substrate. Typically, the pretreated substrate is rinsed with deionized water before the deposition of the metallic film on the pretreated substrate.

In accordance with this invention, an article of matter can be prepared by depositing on a substrate the pretreatment composition comprising an adhesion promoter and a corrosion inhibitor as recited hereinabove, followed by depositing a thin metallic film on the pretreated substrate and optionally coating the metallic film with an organic coating. It has been found that the invention is particularly suitable for the preparation of mirrored substrates.

Surprisingly, it has been found that when the pretreatment composition is applied before the thin metallic film, one obtains mirrored substrates with marked improvement in adhesion and corrosion resistance. Hence, the present invention further encompasses an improved method of depositing a thin metallic film on the substrate, the improvement comprising pretreating the surface of the substrate with the pretreatment composition comprising a protective material, before applying the thin metallic film. In this aspect of the invention, the pretreatment composition can be a protective material comprising an adhesion promoter, a corrosion inhibitor, or a combination thereof. In the use of an adhesion promoter and a corrosion inhibitor, one can apply them separately or together.

It would, of course, be realized that the adhesion promoter or corrosion inhibitor may be specific to a substrate. However, it is believed that given the teaching herein, one skilled in the art can select the appropriate protective material which can be an adhesion promoter or corrosion inhibitor and use them as pretreatment compositions in accordance with this invention.

Application of the pretreatment composition can entail dipping, spraying, flow coating, roll coating or the like. The thin metallic film is generally coated with mirror-back coatings. Illustrative examples of the mirror-back coatings can be organic coatings, e.g., conventional air-dry, force dry, or thermosetting alkyds, primers, sealer coats, and barrier coatings.

The invention is further illustrated by the following non-limiting examples.

EXAMPLE A

This example illustrates the pretreatment composition of this invention and methods of making and using the same.

A pretreatment composition of this invention was prepared with a solution of five parts by weight of 2-mercaptothiazoline in ethanol. Twenty parts by weight of the above solution was added to 76 parts by weight of deionized water followed by addition of 4 parts by weight of gamma-aminopropyltriethoxy silane (A-1100), available from Union Carbide Corporation.

The resultant composition was applied to the surface of a cleaned strip of glass (8"×12") by flooding or spraying the surface. The strip of glass was then rinsed with deionized water. Thereafter, a thin film of silver (700–750A°) (70–75 milligrams per square foot) was deposited on the glass by electroless deposition (spraying). The resulting mirror was air-dried and preheated to about 100° F. A mirror backing made up of a clear lead-free vehicle comprising a resinous blend such as found in PPG Industries, Inc. (hereinafter "PPG"s) NEW GENERATION ® coatings was then applied over the thin metallic film and cured at 260° F. by infrared.

The resultant "copper-free" (silver-only) mirror was evaluated by copper chloride/acetic acid (five percent sodium chloride) salt spray (CASS) test and showed good corrosion resistance.

ADDITIONAL EXAMPLES

The pretreatment compositions of the following examples were prepared and applied in essentially the same manner as described in Example A.

EXAMPLE I

| Ingredients | Parts per Hundred (pph) |
| --- | --- |
| Carrier(s)[a] | 95.0 |
| Substituted thiazoline[b] | 1.0 |
| Silane[c] | 4.0 |

[a]Carrier(s): ethanol.
[b]Robinson Brothers, Ltd. (RBL): 2-thiazoline-thione.
[c]Union Carbide: A-1100, which is gamma-aminopropyltriethoxysilane.

EXAMPLES 2 TO 5

| Ingredients | Parts per Hundred (pph) |
| --- | --- |
| Carrier(s)[a] | 95.0 |

-continued

| Ingredients | Parts per Hundred (pph) |
|---|---|
| Azole[b] | 1.0 |
| Silane[c] | 4.0 |

[a]Carrier(s): ethanol.
[b]Azole: (Example 2) Sherwin Williams: COBRATEC 99, (Example 3) Aldrich Chemical Co., Inc.: 2-mercaptothiazole; (Example 4) Aldrich Chemical Co., Inc.: 2-mercaptobenzothiazole; (Example 5) Eastman Kodak Co.: 2-aminothiazole.
[c]Union Carbide: A-1100.

EXAMPLE 6

| Ingredients | Parts per Hundred (pph) |
|---|---|
| Carrier(s)[a] | 95.0 |
| Substituted carboxylic acid(s)[b] | 1.0 |
| Silane[c] | 4.0 |

[a]Carrier(s): Solvents: water/ethanol in a ratio of 76/19.
[b]Ciba Geigy: IRGACOR 23-252 (2-thio-2'-benzothiazolyl)butanedioic acid.
[c]Union Carbide: A-1100.

EXAMPLES 7 AND 8

| Ingredients | Parts per Hundred (pph) |
|---|---|
| Carrier(s)[a] | 95.0 |
| Substituted thiazoline[b] | 1.0 |
| Titanate[c] | 4.0 |

[a]Carrier(s): Ethanol.
[b]Robinson Brothers, Ltd.: 2-thiazoline-thione.
[c]DuPont Chemical Co. (titanium compounds): Tyzor AA (Example 7), Tyzor TE (Example 8).

EXAMPLE 9

| Ingredients | Parts per Hundred (pph) |
|---|---|
| Carrier(s)[a] | 95.0 |
| Substituted thiazoline[b] | 1.0 |
| Neoalkoxy zironate[c] | 4.0 |

[a]Carrier(s): Alcohol(s).
[b]Robinson Brothers, Ltd.: 2-thiazoline-thione.
[c]Kenrich Chemical Co. (zirconium compound): LZ-44: neoalkoxy tris(ethylene diamino)ethyl zirconate.

TEST DATA

The above composition was applied to glass prior to the deposition of silver-only (Ag) or silver/copper (Ag/Cu) mirrors coated with mirror-back coatings and cured. The resultant mirrors were evaluated and rated as follows:

| Key Number Rating | % Failure | Description | Description by Amount of Failure |
|---|---|---|---|
| 10 (Best) | 0 | Excellent (Exc) | No change/none |
| 9 | 10 | Very good-Exc | Trace |
| 8 | 20 | Very good (VG) | Very slight (VSL) |
| 7 | 30 | Good - VG | Slight - VSL |
| 6 | 40 | Good (G) | Slight (SL) |
| 5 | 50 | Fair - G | Moderate - SL |
| 4 | 60 | Fair (F) | Moderate (MOD) |
| 3 | 70 | Poor - F | Considerable - MOD |
| 2 | 80 | Poor (P) | Considerable (CON) |
| 1 | 90 | Very Poor - VP | Severe - CON |
| 0 | 100 | Very Poor (VP) | Severe (SEV) |

TABLE 1

| Substrate | Pretreatment Composition | CASS Test[a] Ratings Edge Corrosion[b] | Delamination[c] |
|---|---|---|---|
| Glass/Silver/Copper | None | 4 | 5 |
| Glass/Silver/Copper | Composition of Example 1 | 8 | 8 |
| Glass/Silver | None | 1 | 5 |
| Glass/Silver | Composition of Example 1 | 5 | 8 |

[a]CASS Test: (Copper-accelerated-acetic acid-salt spray)/Modified (four-hour test). ASTM-B368-68 for screening tests with clear (non-leaded) alkyd-melamine coating system as found in PPG's NEW GENERATION ® coatings.
[b]Edge Corrosion: Rating of amount (millimeters) of corrosion on edge of panel (10 = Best) on a scale of 0 to 10.
[c]Delamination: Rating of the amount of delamination of coating and/or coating + metal from panel.

TABLE 2

| Substrate | Pretreatment Composition | CASS Test Ratings Edge Corrosion | Delamination |
|---|---|---|---|
| Glass/Silver/Copper | None | 4 | 5 |
| Glass/Silver/Copper | Composition of Example 1 | 8 | 8 |
| Glass/Silver/Copper | Composition of Example 2 | 7 | 8 |
| Glass/Silver/Copper | Composition of Example 3 | 7 | 8 |
| Glass/Silver/Copper | Composition of Example 4 | 6 | 7 |

TABLE 3

| Substrate | Pretreatment Composition | CASS Test Ratings Edge Corrosion | Delamination |
|---|---|---|---|
| Glass/Silver | None | 1 | 5 |
| Glass/Silver | Composition of Example 1 | 5 | 8 |
| Glass/Silver | Composition of Example 2 | 3 | 7 |
| Glass/Silver | Composition of Example 3 | 3 | 8 |
| Glass/Silver | Composition of Example 4 | 3 | 6 |
| Glass/Silver | Composition of Example 5 | 4 | 8 |

TABLE 4

| Substrate | Pretreatment Composition | CASS Test Ratings Edge Corrosion | Delamination |
|---|---|---|---|
| Glass/Silver/Copper | None | 7 | 8 |
| Glass/Silver | None | 2 | 5 |
| Glass/Silver | Composition of Example 6 | 9 | 6 |

TABLE 5

| Substrate | Pretreatment Composition | CASS Test Ratings Edge Corrosion | Delamination |
|---|---|---|---|
| Glass/Silver/Copper | None | 8 | 5 |
| Glass/Silver | None | 3 | 4 |
| Glass/Silver | Composition of Example 6 | 10 | 7 |
| Glass/Silver | Composition of Example 7 | 4 | 8 |
| Glass/Silver | Composition of Example 8 | 6 | 5 |

TABLE 6

| Substrate | Pretreatment Composition | CASS Test Ratings Edge Corrosion | Delamination |
|---|---|---|---|
| Glass/Silver/Copper | None | 4 | 5 |
| Glass/Silver | None | 1 | 5 |
| Glass/Silver | Composition of Example 9 | 4 | 8 |

TABLE 7

| Substrate | Pretreatment Composition | CASS Test[a] Ratings Numerical Rating | % of Failure[b] |
|---|---|---|---|
| Glass/Silver/Copper | None | 0 | 100 |
| Glass/Silver | None | 0 | 100 |
| Glass/Silver | Composition of Example 7 | 8 | 20 |
| Glass/Silver | Composition of Example 8 | 7 | 30 |
| Glass/Silver | Composition of Example 9 | 4 | 60 |

[a]CASS Test: Modified ASTM-B368-68 for screening studies using an alkyd-melamine conventional thermosetting coating such as is available from Reichold Chemical Co. Test used was: test to failure of controls.
[b]Percent of Failure: Number rating corresponding to the percent of corrosion failure in the above test procedure.

TABLE 8

| Substrate | Pretreatment Composition | CASS Test[a] Ratings Edge Corrosion[b] | Delamination[c] |
|---|---|---|---|
| Glass/Silver/Copper | None | 4 | 9 |
| Glass/Silver | None | 2 | 9 |
| Glass/Silver | Composition of Example 1 | 5 | 10 |
| Glass/Silver | Composition of Example 6 | 9 | 10 |
| Glass/Silver | Composition of Example 7 | 5 | 8 |
| Glass/Silver | Composition of Example 8 | 6 | 7 |

[a]CASS Test: Modified ASTM-B368-68 for screening tests with clear water reducible conventional air dry alkyd system, available from Reichold Chemical Co.
[b]Edge Corrosion: Refer to Example 1 footnote.
[c]Delamination: Refer to Example 1 footnote.

TABLE 9

| Substrate | Pretreatment Composition | CASS Test[a] Rating Edge Corrosion[b](mm) | Numerical Rating |
|---|---|---|---|
| Glass/Silver/Copper | None | 0.75 | (7) |
| Glass/Silver | None | 2.0 | (5) |
| Glass/Silver | Composition of Example 6 | 0.0 | (10) |
| Glass/Silver | Composition of Example 8 | 0.5 | (8) |

[a]CASS Test: Standard ASTM-B368-68 for pigmented conventional thermosetting alkyd-melamine coatings such as "NEW GENERATION ®" coatings containing corrosion inhibitors.
[b]Edge Corrosion: Millimeters of corrosion measured and the corresponding numerical rating.

TABLE 10

| Substrate | Pretreatment Composition | Salt Spray[a] Test 150 Hours[b] | | 300 Hours[c] | |
|---|---|---|---|---|---|
| | | Edge Corrosion | Delamination | Edge Corrosion | Delamination |
| Glass/Silver/Copper | None | 9 | 10 | 9 | 10 |
| Glass/Silver | None | 6 | 5 | 2 | 5 |
| Glass/Silver | Composition of Example 6 | 9 | 8 | 9 | 8 |
| Glass/Silver | Composition of Example 7 | 10 | 10 | 9 | 10 |
| Glass/Silver | Composition of Example 8 | 10 | 10 | 9 | 10 |

[a]Salt Spray Test: U.S. Government Standard DDM-411b - 20 percent salt used with standard conventional thermosetting coatings (pigmented).
[b]150 Hours: Initial screening using DDM-411b.
[c]300 Hours: Extended test >150 hours.

TABLE 11

| Substrate | Pretreatment Composition | CASS Test[a] Rating Edge Corrosion |
|---|---|---|
| Glass/Silver/Copper | None | 8 |
| Glass/Silver | None | 5 |
| Glass/Silver | Composition of Example 7 | 8 |
| Glass/Silver | Composition of Example 8 | 9 |

[a]CASS Test: Standard ASTM-B368-68 for conventional air dry/force dry alkyd type, such as is available from PPG Industries, Inc. as MIR-O-CRON ® mirror-back coatings.

TABLE 12

| Substrate | Pretreatment Composition | Salt Spray[a] Edge Corrosion |
|---|---|---|
| Glass/Silver/Copper | None | 9 |
| Glass/Silver | None | 3 |
| Glass/Silver | Composition of Example 6 | 8 |
| Glass/Silver | Composition of Example 7 | 5 |
| Glass/Silver | Composition of Example 8 | 9 |

[a]DDM-411b Standard - 20 percent salt used with standard conventional air dry/force dry MIR-O-CRON ® coating.

TABLE 13*

TEST RESULTS OF MIRROR-BACK COATINGS[a] ON UNTREATED VS. TREATED MIRROR SUBSTRATE

| Mirror-Type | Pretreatment | DFT (Mils) | Adhesion[b] (Cross Hatch) | Humidity[c] (Blisters) | NH$_3$ + S.S.[d] (Edge UC/Spots) | CASS[e] (Edge UC/Spots) | Salt Spray-150 Hours[f] (Edge UC/Spots) | ("X"-Scribe) |
|---|---|---|---|---|---|---|---|---|
| Ag/Cu | None | 1.5 | 4 | None | 6.0/8F | <0.25/8VF | 0.0/8VF | <0.25 |
| Ag-only | None | 1.5 | 4 | None | >10.0/— | 2.8/4F | 8.0/4VF | 8.0 |
| Ag-only | Composition | 1.5 | 4 | None | 0.0/8VF | <0.25/8-10VF | 0.0/None | 0.0 |

TABLE 13*-continued

TEST RESULTS OF MIRROR-BACK COATINGS[a]
ON UNTREATED VS. TREATED MIRROR SUBSTRATE

| Mirror-Type | Pretreatment | DFT (Mils) | Adhesion[b] (Cross Hatch) | Humidity[c] (Blisters) | NH$_3$ + S.S.[d] (Edge UC/Spots) | CASS[e] (Edge UC/Spots) | Salt Spray-150 Hours[f] (Edge UC/Spots) | ("X"-Scribe) |
|---|---|---|---|---|---|---|---|---|
| | of Ex. 6 | | | | | | | |

[a]NEW GENERATION ® Mirror Backing applied at 1.5 mils dry.
[b]Adhesion - based on ASTM-D3359 Ratings (5 = Best on a scale of 0 to 5).
[c]Humidity - Condensing humidity test @ 60° C./150 hours - ratings based on ASTM-D714 (Blisters).
[d]NH$_3$ + S.S. - Ammonia + Salt Spray Test - ratings are millimeters of edge undercutting (UC) and size and number of spots on mirror face.
[e]CASS - based on ASTM-B368-68 - ratings are the same as above.
[f]Salt Spray - 150 hours - based on Government Standard Test DDM-114b - ratings are in millimeters on edge under cutting (UC) size and number of spots and "X"-scribe rating is millimeters of corrosion extending from the scribe mark.
*The numbers here are actual measurements.

TABLE 14

| Substrate | Pretreatment Composition | CASS Test[a] Ratings | |
|---|---|---|---|
| | | Edge Corrosion[b] | Delamination[c] |
| Glass/Silver/Copper | None | 4 | 5 |
| Glass/Silver | None | 1 | 5 |
| Glass/Silver | A-1100 (Alone)[d] | 4 | 10 |
| Glass/Silver | 2-Mercaptothiazoline (Alone)[e] | 3 | 7 |
| Glass/Silver | Composition of Example 1 | 6 | 7 |
| Glass/Silver | A-1100 + 2-Mercaptothiazoline[f] | 6 | 8 |
| Glass/Silver | 2-Mercaptothiazoline (Post)[g] | 4 | 6 |

[a]ASTM-B368-68 for screening tests with clear (non-leaded) alkyd-melamine coating system as found in PPG's NEW GENERATION ® coatings.
[b]Edge Corrosion: Rating of amount (millimeters) of corrosion on edge of panel (10 = Best) on a scale of 0 to 10.
[c]Delamination: Rating of the amount of delamination of coating and/or coating + metal from the panel.
[d]A-1100: 4 percent of gamma-aminopropyltriethoxy silane in ethanol.
[e]2-mercaptothiazoline: 1 percent solution in ethanol.
[f]A-1100 was applied first and then the 2-mercaptothiazoline was applied as separate steps.
[g]Post: Denotes that a 1% solution of 2-mercaptothiazoline was applied directly to the metallic film in contrast with prior application before deposition of the metallic film.

Therefore, what is claimed is:

1. An improved process of depositing a thin metallic film on a substrate by applying to the substrate a thin metallic film the improvement comprising pretreating the surface of the substrate with a pretreatment composition comprising a protective material before applying the thin metallic film to the substrate, said pretreatment composition comprising
   (A) an adhesion promoter bonding or coupling to the interface of the substrate and the thin metallic film and
   (B) a corrosion inhibitor wherein (A) is selected from the group consisting of a silane compound, a titanium compound, a zirconium compound, and a mixture thereof, and (B) is selected from the group consisting of a nitrogen containing heterocyclic compound, a corrosion inhibitive metallic compound other than recited in (A) and a mixture thereof.

2. An improved process of depositing a thin metallic film of claim 1 wherein the protective material comprises an adhesion promoter and a corrosion inhibitor.

3. An improved process of claim 1 further comprising rinsing the pretreated substrate before depositing the thin metallic film thereon.

4. An improved process of claim 3 wherein rinsing is conducted with deionized water.

5. An improved process of claim 1 which further comprises depositing an organic coating over the thin metallic film.

6. An improved process of claim 5 wherein the organic coating is an alkyd/melamine coating.

7. An article of matter which is prepared by the process of claim 1.

8. An article of matter which is prepared by the process of claim 5.

9. An article of matter of claim 8 wherein the substrate is glass.

10. An article of matter of claim 1 wherein the substrate is plastic.

11. An article of matter of claim 8 wherein the thin metallic film is a layer of silver or layer of silver followed by a layer of copper.

* * * * *